United States Patent
Lee et al.

(10) Patent No.: US 11,646,284 B2
(45) Date of Patent: May 9, 2023

(54) METHOD AND APPARATUS TO IMPROVE CONNECTION PITCH IN DIE-TO-WAFER BONDING

(71) Applicant: Rambus Inc., San Jose, CA (US)

(72) Inventors: Dongyun Lee, Sunnyvale, CA (US); Ming Li, Fremont, CA (US)

(73) Assignee: Rambus Inc., San Jose, CA (US)

( * ) Notice: Subject to any disclaimer, the term of this patent is extended or adjusted under 35 U.S.C. 154(b) by 39 days.

(21) Appl. No.: 17/493,264

(22) Filed: Oct. 4, 2021

(65) Prior Publication Data

US 2022/0108964 A1 Apr. 7, 2022

Related U.S. Application Data

(60) Provisional application No. 63/087,649, filed on Oct. 5, 2020.

(51) Int. Cl.
*G11C 29/12* (2006.01)
*H01L 23/00* (2006.01)
*H01L 25/065* (2023.01)
*H01L 21/66* (2006.01)

(52) U.S. Cl.
CPC .......... *H01L 24/08* (2013.01); *G11C 29/1201* (2013.01); *H01L 22/34* (2013.01); *H01L 25/0657* (2013.01); *H01L 2224/08145* (2013.01); *H01L 2924/1436* (2013.01); *H01L 2924/37001* (2013.01)

(58) Field of Classification Search
None
See application file for complete search history.

(56) References Cited

U.S. PATENT DOCUMENTS

| | | | |
|---|---|---|---|
| 5,153,507 A | 10/1992 | Fong et al. | |
| 5,994,912 A | 11/1999 | Whetsel | |
| 6,379,982 B1 | 4/2002 | Ahn et al. | |
| 7,170,183 B1 | 1/2007 | Kim et al. | |
| 8,804,394 B2 | 8/2014 | Ware et al. | |
| 8,982,598 B2 | 3/2015 | Franzon et al. | |
| 2008/0175080 A1* | 7/2008 | Kim ............... | G01R 31/318511 365/201 |
| 2022/0115343 A1* | 4/2022 | Periyannan ............. | H01L 24/13 |

OTHER PUBLICATIONS

Chow, Alex et al., "Enabling Technologies for Multi-Chip Integration Using Proximity Communication", IEEE 978-1-4244-2782-6/09, 2009, pp. 39-42, 4 pages.

* cited by examiner

*Primary Examiner* — Tan T. Nguyen
(74) *Attorney, Agent, or Firm* — Lance Kreisman; Peninsula Patent Group

(57) ABSTRACT

Semiconductor devices, packaging architectures and associated methods are disclosed. In one embodiment, a semiconductor device is disclosed. The semiconductor device includes a first semiconductor die having a first bonding surface that is formed with a first set of contacts patterned with a first connection pitch. A second semiconductor die has a second bonding surface that is formed with a second set of contacts patterned with a second connection pitch. The second set of contacts are further patterned with a paired offset. The second semiconductor die is bonded to the first semiconductor die such that the first set of contacts is disposed in opposed electrical engagement with at least a portion of the second set of contacts.

20 Claims, 7 Drawing Sheets

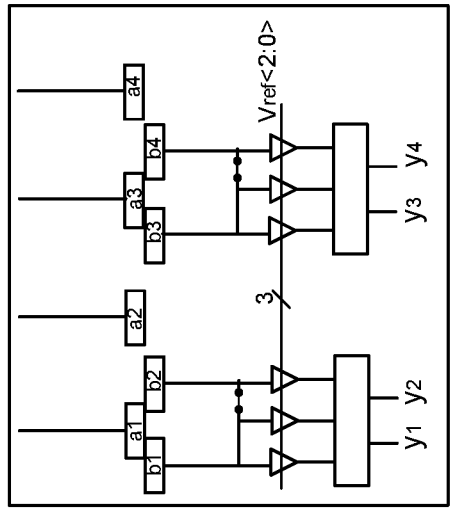
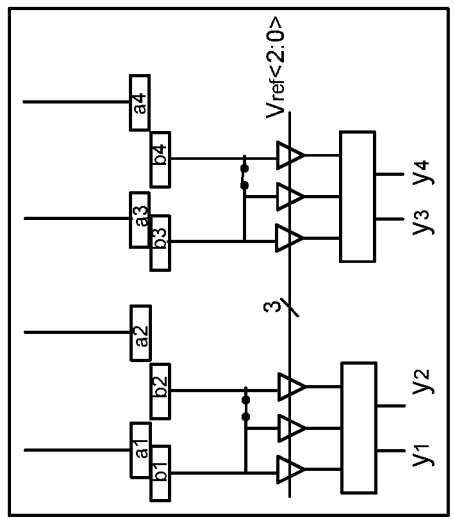
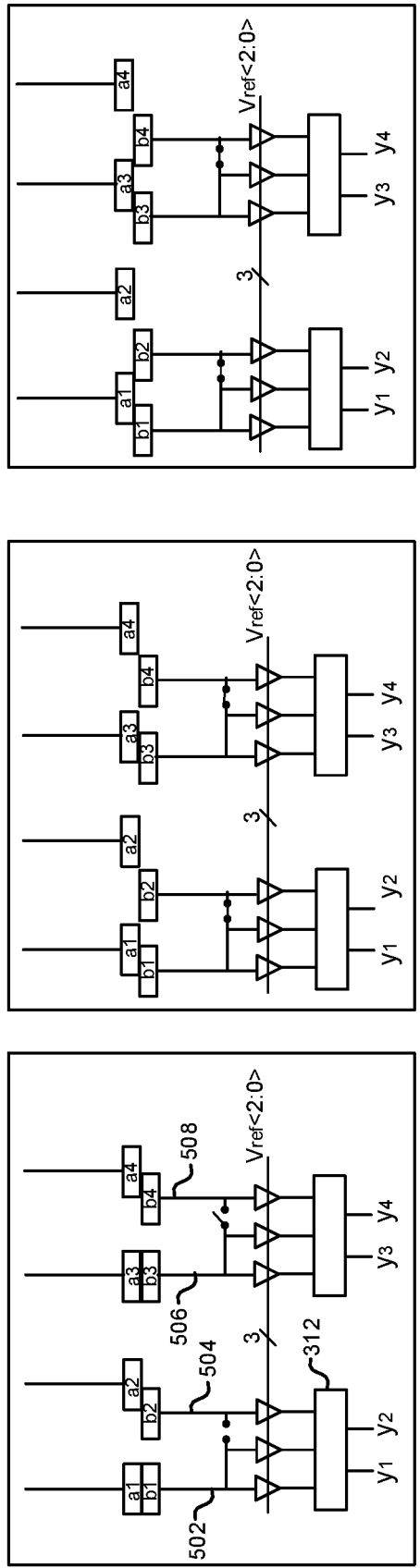
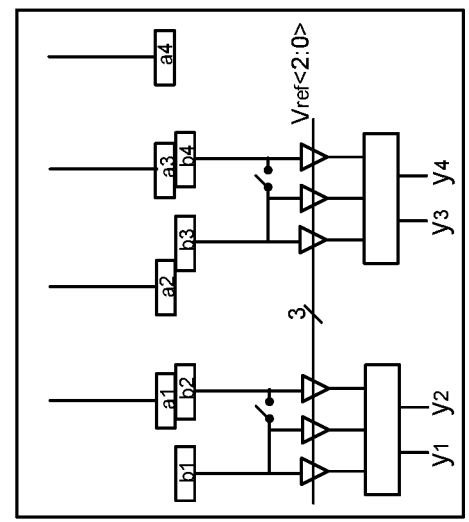
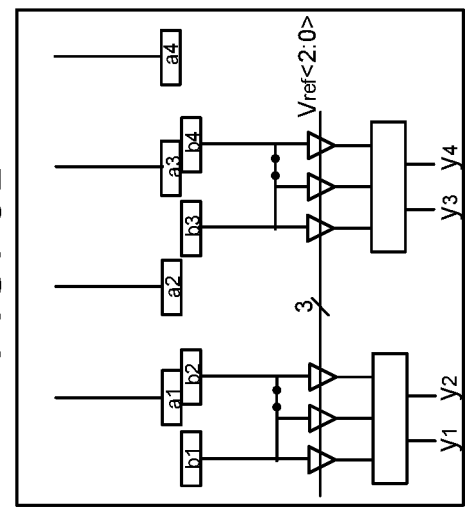

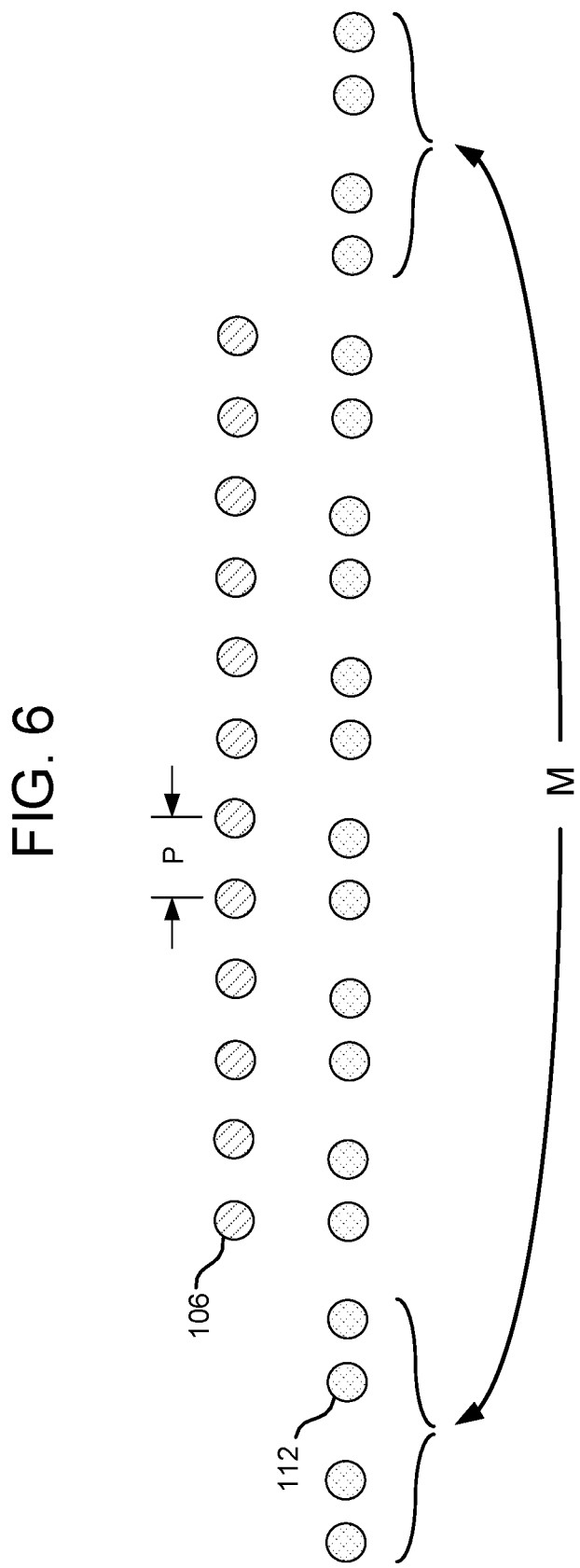

METHOD AND APPARATUS TO IMPROVE CONNECTION PITCH IN DIE-TO-WAFER BONDING

CROSS-REFERENCE TO RELATED APPLICATIONS

This application is a Non-Provisional that claims priority to U.S. Provisional Application No. 63/087,649 filed Oct. 5, 2020, entitled METHOD AND APPARATUS TO IMPROVE CONNECTION PITCH IN DIE-TO-DIE WAFER BONDING, which is incorporated herein by reference in its entirety.

TECHNICAL FIELD

The disclosure herein relates to semiconductor devices, packaging and associated methods.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIGS. 5A-5E illustrate various data reception techniques that address the possible mis-alignment scenarios shown in FIGS. 2A-2E.

FIG. 6 illustrates one embodiment of a contact array utilizing redundant contacts to allow for connection pitch reduction below a given mechanical alignment accuracy.

DETAILED DESCRIPTION

Semiconductor devices, packaging structures and associated methods are disclosed. In one embodiment, a semiconductor device is disclosed. The semiconductor device includes a first semiconductor die having a first bonding surface that is formed with a first set of contacts patterned with a first connection pitch. A second semiconductor die has a second bonding surface that is formed with a second set of contacts patterned with a second connection pitch. The second set of contacts are further patterned with a paired offset. The second semiconductor die is bonded to the first semiconductor die such that the first set of contacts is disposed in opposed electrical engagement with at least a portion of the second set of contacts. By employing a paired offset in the pitch of the second semiconductor device, expected contact misalignments between the two semiconductor devices due to manufacturing equipment accuracy limitations may be straightforwardly addressed, significantly improving device yields and reliability. Other embodiments utilize configurable interface circuitry to selectively redirect data from a defective signaling path to a non-defective signaling path and increase the data rate of the shared data path to maintain overall data throughput between the semiconductor devices even with a reduction in the number of non-defective signaling paths.

Figure 1:
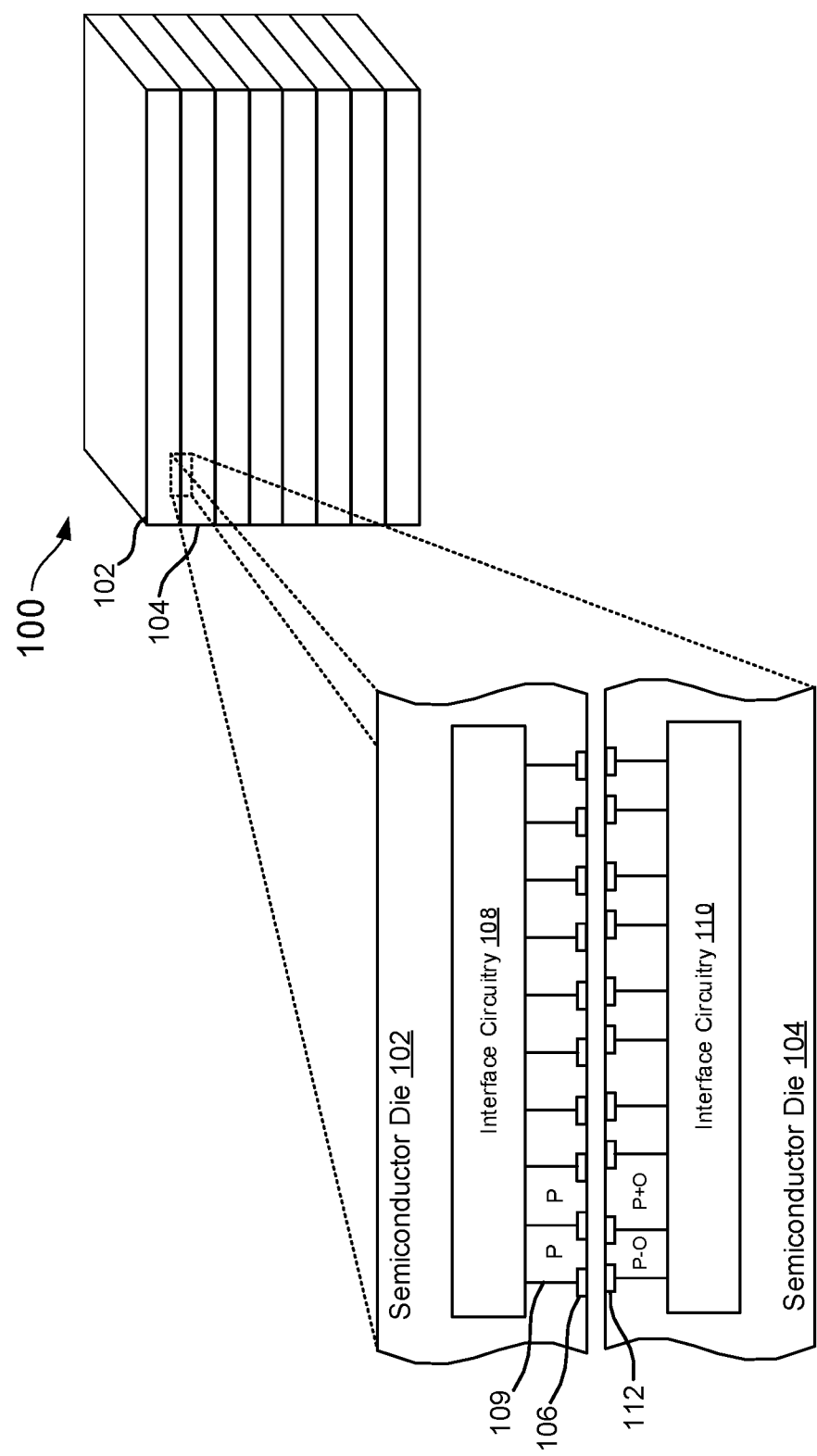
FIG. 1 illustrates one embodiment of a semiconductor die stack, including a first semiconductor die bonded to a second semiconductor die.

With reference to FIG. 1, a multi-die stack of semiconductor die is shown, generally designated 100. The multi-die stack may be formed consistent with one of several standardized stacked die architectures, such as High Bandwidth Memory (HBM), Wide I/O, Hybrid Memory Cube, and so forth. The multi-die stack 100 generally includes oppositely disposed semiconductor die 102 and 104, that may take the form of, for example, dynamic random access memory (DRAM) die and/or non-volatile memory die. Each die of the multi-die stack may be bonded to a vertically adjacent die via a die-to-die or die-to-wafer hybrid bonding process generally performed during semiconductor device manufacture.

Further referring to FIG. 1, the first semiconductor die 102 is formed with a first set of metal contacts 106 that exhibit a periodic center-to-center lateral pitch dimension of P. Each contact is electrically connected to interface circuitry 108 through a conductive path 109. The interface circuitry 108 employs various input/output (I/O) circuits to transmit and receive data along selected ones of the conductive paths. Further details for configurable embodiments of the interface circuitry are described below.

Further referring to FIG. 1, the second semiconductor die 104 is formed similar to the first semiconductor die 102, including second interface circuitry 110 connected to a second set of contacts 112 disposed in opposed electrical engagement with the first set of contacts 106 of the first semiconductor die 102. Due to mechanical alignment limitations of pick-and-place die-to-die aligners, mechanical misalignments between the opposed first and second sets of contacts 106 and 112 may occur, often causing open circuit and/or short circuit defects. In an effort to reduce connection pitch, and maximize the repairability of the bonded die post-manufacture, the pattern exhibited by the second set of contacts 112 also exhibits the pitch "P", but in an aperiodic sense where the first and second adjacent contacts (a first pair) will the pitch P, less an offset "O", while the second and third contacts that are adjacent to each other exhibit the pitch P, plus the offset O. Thus the pitch between successive contacts alternates between "P−O" and "P+O."

As noted above, mechanical inaccuracies often occur during the manufacturing process, causing the first and second sets of contacts for the first and second semiconductor die to be vertically mis-aligned. However, by intentionally inserting the paired offset O into the pitch pattern for one of the two semiconductor die, potential misalignments between the first and second sets of contacts may be narrowed to a relative few misalignment scenarios that may be addressed via configurable interface circuits more fully described below.

Figure 2A:
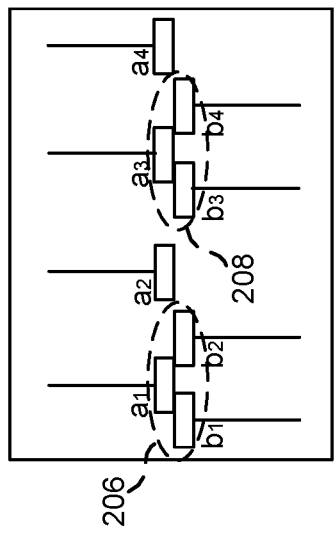
FIGS. 2A-2E illustrate various possible mis-alignment scenarios associated with the bonded semiconductor dies of FIG. 1.

FIGS. 2A-2E illustrate five potential mis-alignment cases involving first and second sets of contacts a1-a4 and b1-b4 that correspond to the first semiconductor die 102 and the second semiconductor die 104, respectively. Referring now to FIG. 2A, the first set of contacts 106 (individually identified as a1-a4) have contact widths w1, and a periodic or repeating pitch "P" between adjacent contact centers. The second set of contacts 112 (b1-b4) have contact widths w2 and an alternating pitch P+/−O between adjacent contact centers. For clarity purposes, signal paths 109 are omitted from FIG. 2A. In one embodiment, the relationships between the contact widths w1 and w2, the pitch P, and the offset O are constrained by the expression:

$$w1+w2<P<w1+w2+O$$

The constraint provides for a predictable set of misalignment scenarios that may be repairable through the use of configurable interface circuitry, described more fully below.

Further referring to FIG. 2A, for a first scenario, the first set of contacts 106 (a1-a4) for the first semiconductor device 102 are directly aligned with the second set of contacts 112 (b1-b4) of the second semiconductor device 104, other than the intentionally induced offset O. The contacts a1-a4 thus mechanically and electrically engage the contacts b1-b4 in a one-to-one correspondence such that the signaling paths exhibit no short circuit or open circuit defects.

Figure 2B:
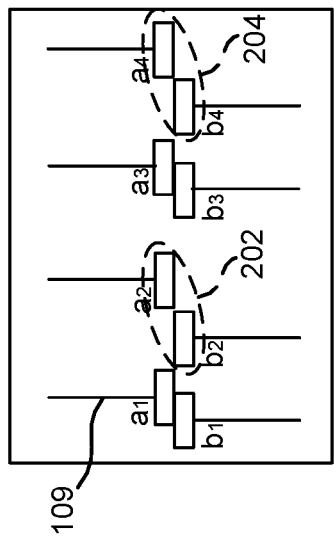

FIG. 2B illustrates a similar alignment between the first and second sets of contacts 106 and 112 of the two semiconductor die 102 and 104, except that the entire set of first contacts a1-a4 are shifted to the right (relative to the second set of contacts b1-b4) by approximately half the contact width w1. While contacts a1 and a3 still connect to contacts b1 and b3, respectively, the overall misalignment results in an open connection, at 202, between contacts a2, b2, and at 204, between contacts a4, b4.

Figure 2C:
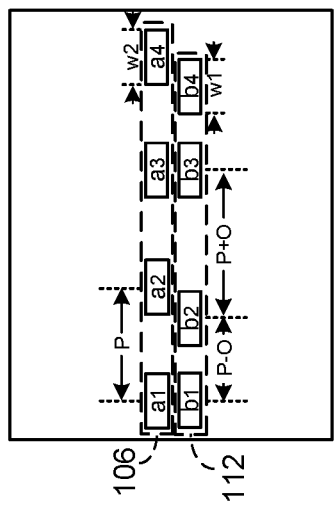

Referring now to FIG. 2C, a further shift in the first set of contacts a1-a4 to the right results in a short-circuit between contacts b1 and b2, at 206, caused by a common connection to contact a1 of the first set of contacts. Open connections to contacts a2 and a4 are also shown, as is a second short circuit condition involving contacts a3, b3 and b4, at 208.

Figure 2D:
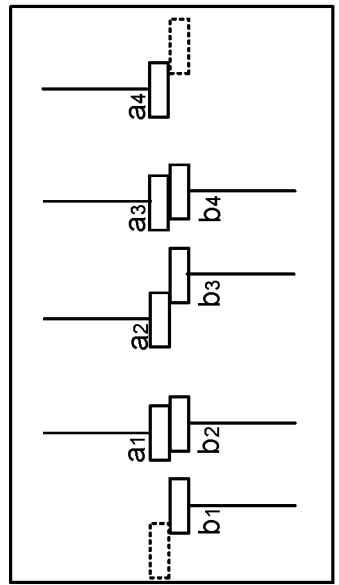

A misalignment of the first set of contacts 106 further to the right results in the scenario shown in FIG. 2D, where contacts a1,b2 and a3,b4 form unintended conductive paths, at 210 and 212, while contacts b1, a2, b3, and a4 are disconnected.

Figure 2E:
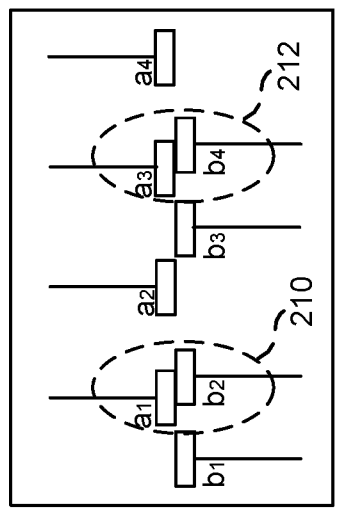

A fifth scenario results from a further misalignment shift in the first set of contacts a1-a4 to the right, shown in FIG. 2E, resulting in a shift in contact alignments by more than a full contact width w1, such that contacts a1,b2 are connected, contacts a2,b3 are connected, and contacts a3,b4 are connected. Contacts b1 and a4 are connected, albeit to one of a different set of contacts that are not part of the first or second set of contacts (due to the misalignment).

The scenarios described above generally fall into two misalignment groups. The first group involves the scenarios shown in FIGS. 2A and 2E, where four conductive paths remain available (assuming a signal path shift for the case of FIG. 2E) with no open or short circuit connections detected between the two sets of contacts. The second group involves the scenarios shown in FIGS. 2B-2D, where at least two of four non-defective conductive paths are available. Recognizing that each contact of the respective first and second sets of contacts are connected to a respective interface circuit via a signaling path, by employing a way to flexibly configure the signaling paths between the interface circuitry of each die and the corresponding sets of contacts, and modifying signaling rates where less than all of the signaling paths are non-defective, the two semiconductor die can still successfully transfer data even in the presence of misalignment defects between opposing sets of contacts.

Figure 3:
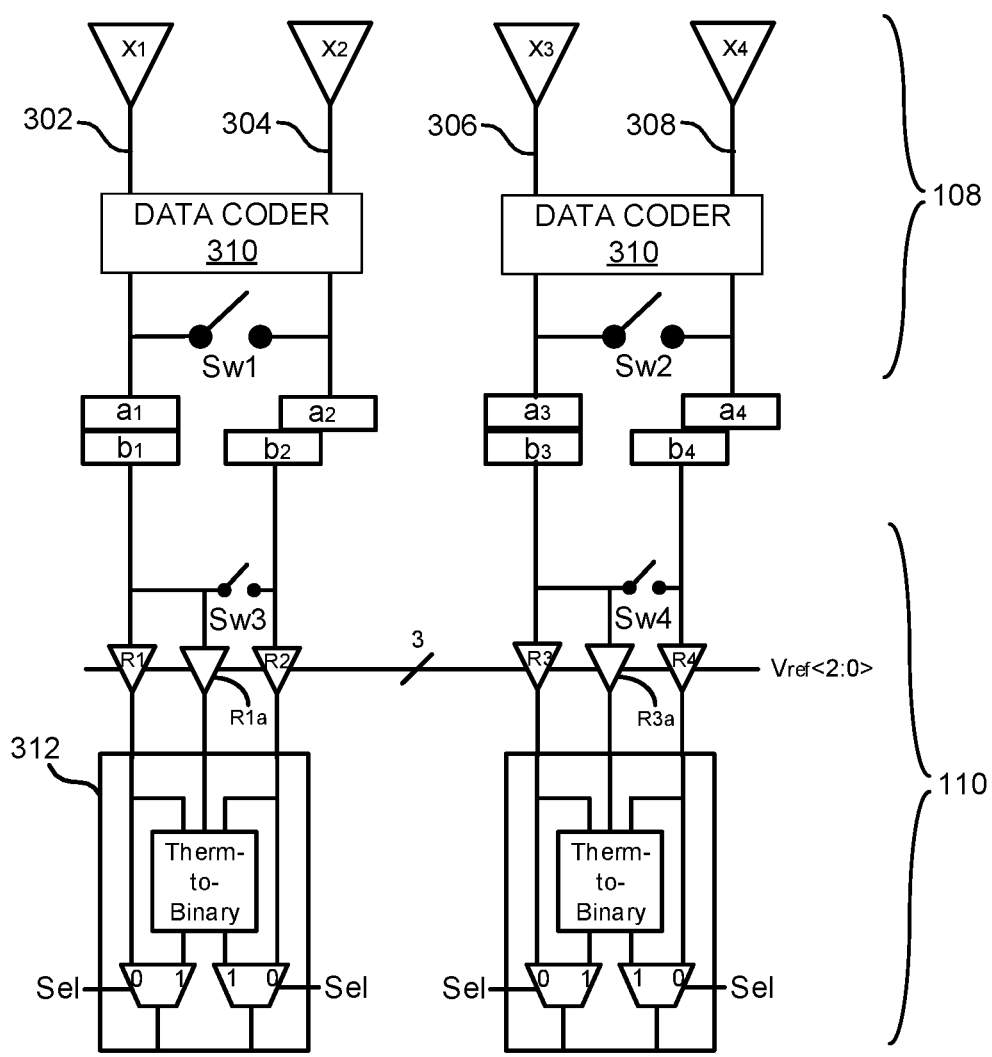
FIG. 3 illustrates one embodiment of the configurable interface circuitry employed to address the potential mis-alignments of FIGS. 2A-2E.

FIG. 3 illustrates configurable interface circuitry that corresponds to interface circuitry 108 employed by the first semiconductor die 102 and interface circuitry 110 employed by the second semiconductor die 104 to address the misalignment cases of FIGS. 2A-2E. The configurable interface circuitry cooperates with the paired offset of the second semiconductor die in an effort to maximize device yields during manufacturing, and to repair devices in the field that may incur defects over time as a result of thermal and aging effects. For purposes of clarity, the overall interface circuitry assumes that the interface circuitry 108 of the first semiconductor die 102 is transmitting data and/or other control signals to the interface circuitry 110 of the second semiconductor die 104 via the first set of contacts a1-a4 and the second set of contacts b1-b4. For some embodiments, the signal transfers may be bidirectional through use of mirrored transmitter/receiver ("transceiver") circuitry in the respective interface circuits. The interface circuitry 108 and 110 for one or both of the first semiconductor die 102 and the second semiconductor die 104 includes test circuitry (not shown) to detect the existence of short circuit and/or open circuit signal path defects indicating misaligned contact positions. Once the defects are detected, the interface circuitry 108 and 110 may be reconfigured to bypass or avoid any of the detected defective connections.

For example, and further referring to FIG. 3, one embodiment of the interface circuitry 108 of the first semiconductor die 102 includes transmit drivers x1-x4 that are coupled to contacts a1-a4, via paths 302, 304, 306 and 308, respectively. Switches Sw1 and Sw2 are disposed between paths 302,304 and 306,308. At the output of pairs of the transmit drivers are respective data coders 310 that are configurable to operate in either a single-bit binary signaling mode or a multi-bit signaling mode. For one embodiment, each data coder includes a single-bit to multi-bit conversion circuit (not shown) that generates a multi-bit symbol upon receiving multiple single-bit signals. The single-bit to multi-bit conversion circuit generally combines data signals associated with the first signaling path with data signals associated with the second signaling path to form an aggregated signaling channel capable of transferring aggregated data at twice the data rate of the single-bit channel configuration. For one embodiment, the single-bit-to multi-bit conversion circuit converts PAM2 data to PAM4 data. One way to do this is to employ a digital-to-analog converter (DAC) to receive a two-bit input (one bit for feeding to driver x1, and the other bit intended for driver x2), and generate one of four voltage levels (a symbol) corresponding to the input 2-bit code. In alternative embodiments, other forms of data rate doubling may be employed, such as a 2:1 serialization scheme, or double-data-rate signaling schemes that transfer data in response to rising and falling edges of a clock signal.

As noted above, the transmit interface of FIG. 3 is configurable in that it can be changed to operate in a single-bit binary signaling mode and/or in a multi-bit signaling mode, depending upon control information fed to the data coders 310, and proper opening/closing of the switches Sw1 and Sw2. When the switches Sw1 and Sw2 are open, such as during a single-bit binary signaling mode of operation, the driver outputs from x1-x4 feed directly to the corresponding contacts a1-a4. When the switches Sw1 and Sw2 are closed, such as during a PAM4 signaling mode of operation, the driver outputs from x1/x2 may be fed to both contact a1 and a2, while the driver outputs from x3/x4 may be fed to both contacts a3 and a4.

Further referring to FIG. 3, one embodiment of the interface circuitry 110 of the second semiconductor die 104 includes receivers R1-R4, coupled to contacts b1-b4, respectively. Additional receivers R1a and R3a are included in the event PAM4 decoding is required to detect signal voltage levels other than standard single-bit PAM2 "hi" and "low" levels. Switches Sw3 and Sw4 are selectively closed between the inputs of receivers R1, R1a, R2, and R3, R3a, and R4. When the switches are open, placing the circuitry in a binary signaling mode, the receiver inputs to R1-R4 feed directly to the corresponding contacts b1-b4. When the switches are closed, placing the circuitry in a PAM4 signaling mode, the receiver inputs to R1, R1a and R2 form a first three-level sampler.

With continued reference to FIG. 3, when configured in the PAM4 signaling mode, each receiver of the three-level sampler compares the received symbol voltage level to a threshold voltage level (for that receiver) to generate a value that forms a bit of a thermometer code to resolve the overall voltage level of the received PAM4 symbol. The receiver inputs to R3, R3a and R4 form a second three-level sampler that operates similarly to the first 3-level sampler. The receiver outputs feed a converter circuit 312 to selectively convert the generated 3-bit thermometer code to a 2-bit binary code in the event that the switches Sw3 and Sw4 are closed, indicating the PAM4 signaling configuration. Table 1 below shows one example of how four three-bit thermometer code values may be converted to binary code (each value being generated by a respective one of the three receivers based on whether the detected input signal voltage level meets that receiver's threshold voltage). The two-bit binary code value is then used as two data bits received during a single clock cycle, thus doubling the effective data rate for the signaling path used for the pair of contacts b1,b2 or b3,b4. When configured in the single-bit binary mode, with switches Sw3 and Sw4 open, the converter circuit 312 merely passes the received signals directly without any conversion.

TABLE 1

| Therm Code | Binary Code |
| --- | --- |
| 000 | 00 |
| 001 | 01 |
| 011 | 10 |
| 111 | 11 |

FIGS. 4A-4E illustrate transmit interface configurations utilizing the configurable interface circuits of FIG. 3 for successfully transmitting data and/or control signals via non-defective signaling paths corresponding to the contact mis-alignment scenarios of FIGS. 2A-2E.

Figure 4C:
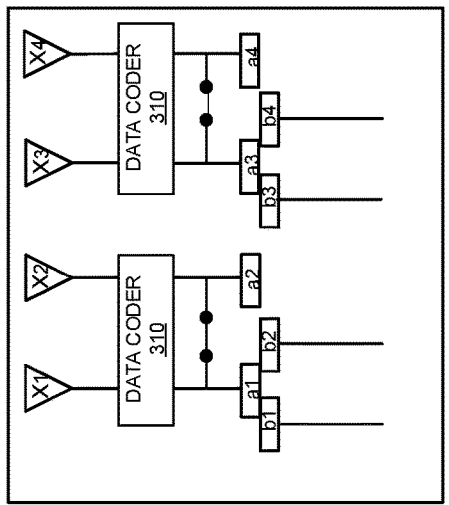
FIGS. 4A-4E illustrate various data transmission techniques that address the possible mis-alignment scenarios shown in FIGS. 2A-2E.
Figure 4B:
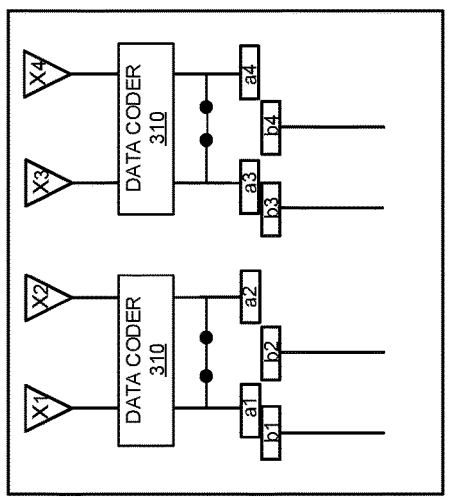
Figure 4A:
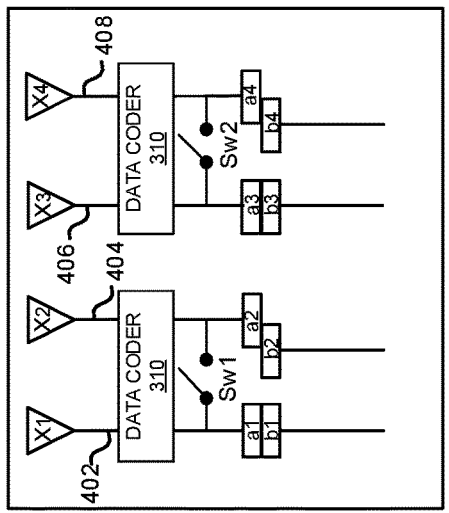

As a first example, FIG. 4A illustrates the interface circuitry of FIG. 3 configured in a single-bit binary mode to pass signals directly from transmitters x1-x4 to contacts a1-a4 (corresponding to the contact alignment of FIG. 2A). via corresponding signaling paths 402, 404, 406 and 408.

In contrast to the single-bit binary configuration of FIG. 4A, FIG. 4B illustrates the transmit interface configured in a multi-bit signaling mode to address the contact misalignment situation of FIG. 2B. With contact a2 failing to connect to contact b2 (a predetermined condition driven by the inclusion of the paired offset O), switches Sw1 and Sw2 are closed, thus allowing for the data along path 404 to be combined with the data on path 402. With double the amount of data, the data coder 310 aggregates the data from transmitters x1,x2 and x3,x4 to code as a multi-bit symbol for transmission at double the data rate.

Figure 4E:
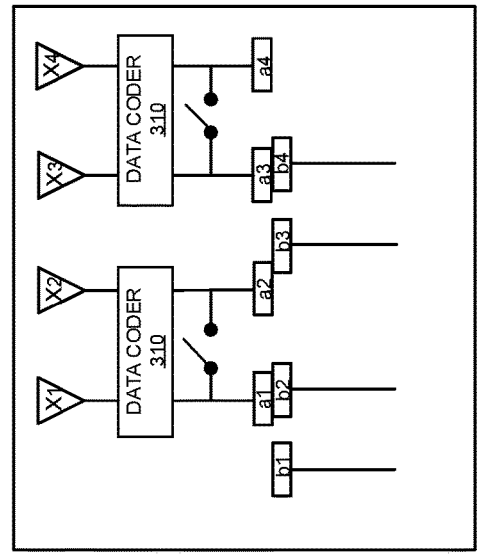
Figure 4D:
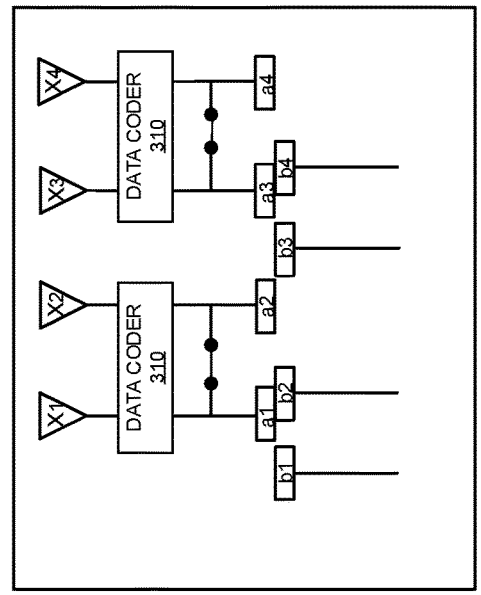

FIGS. 4C and 4D illustrate scenarios similar to FIG. 4B, where the first semiconductor die interface reconfigures signaling paths to provide twice as much data on half the available signaling paths to the second semiconductor die 104.

FIG. 4E illustrates a scenario similar to FIG. 4A, with direct connections intact, albeit offset by a full contact width. In such a situation, one or more of the signaling paths are shifted laterally by a contact pitch interval p to account for the contact misalignment, with the interface circuitry of one or both of the first semiconductor die and second semiconductor die (described below) accounting for the misalignment to provide an interface correction.

FIGS. 5A-5E illustrate receiver interface configurations for successfully receiving data via non-defective signaling paths corresponding to the transmitter configurations of FIGS. 4A-4E. Consistent with the configurable interface circuitry of FIG. 3, the configurations assume that the second semiconductor die 104 is receiving data from the first semiconductor die 102 via the second set of contacts b1-b4. The interface circuitry 110 for the second semiconductor die configures the receive circuitry into one of a single-bit binary signaling mode or a PAM4 signaling mode to match up with the signaling configurations employed by the transmit interface circuitry 108 in compensating for any defective connections.

As noted above, FIG. 5A illustrates the receiver interface circuitry configured in a single-bit binary mode of operation, corresponding to the transmit interface arrangement of FIG. 4A. In this configuration, switches Sw3 and Sw4 are open, decoupling path 502 from 504, and decoupling path 506 from 508. The data received at contacts b1 and b2 are thus directly passed as single-bit binary data to receivers R1, R2, and compared to a single voltage threshold VREF, and fed to outputs y1 and y2 of the conversion circuit 312.

FIGS. 5B, 5C and 5D, on the other hand, illustrate the receiver interface circuitry 110 configured in the PAM4 mode, corresponding to the transmit configurations of FIGS. 4B-4D. With switches Sw3 and Sw4 closed, coded PAM4 data symbols are presented to the three receivers R1, R1a and R2. Separate comparisons of the data symbol voltage level to separate threshold voltages generates a thermometer code value for conversion to a binary bit sequence via the conversion circuitry 312.

Similar to the configuration of FIG. 5A, the configuration of FIG. 5E also reflects the binary mode, corresponding to the transmit configuration of FIG. 4E. However, since the misalignment in the contacts involves more than an entire contact width, an interface connection shift is employed to counter the corresponding misalignment. FIG. 6 illustrates a number M of redundant contacts 112 for the second semiconductor die 104 (FIG. 1) that are disposed outside of a lateral footprint defined by the first set of contacts 106 of the first semiconductor die 102 (FIG. 1). Use of the additional redundant contacts M enables the interface circuit 110 of the second semiconductor die 104 to shift the signaling path connection(s) to account for more than the full contact pitch misalignment. With a pitch of P for the first set of contacts of a first semiconductor die, and the M redundant contacts 112 of the second semiconductor die 104, an alignment accuracy of approximately P×M may be attained.

Figure 7:
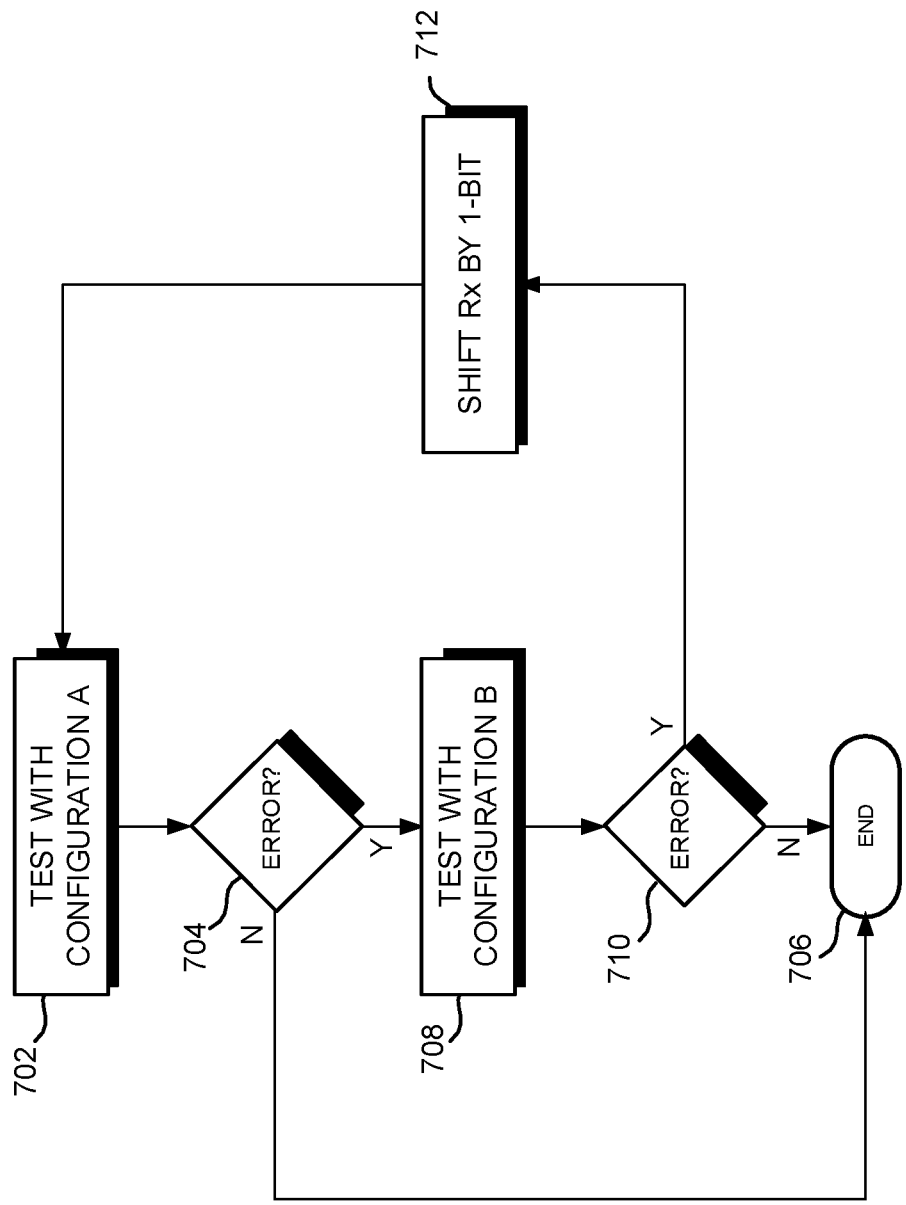
FIG. 7 illustrates a flowchart for one embodiment of a method of operation for interface circuitry employed by the semiconductor die of FIG. 1.

In operation, and referring now to FIG. 7, the stacked die 102 and 104 formed by the die-to-die hybrid bonding process may be tested and electrically reconfigured, as necessary, to repair otherwise fatal device defects due to process misalignments, thermal effects, and the like. The testing and electrical reconfiguring may take place during back-end semiconductor device manufacturing to improve bonded device yields, and/or post-fabrication, with the device operating in the field to repair thermal and/or age-related mechanical connection defects, which include defects due to electro-migration and dielectric breakdown.

For one embodiment, the testing and electrical reconfiguring begins, at 702, with an electrical test performed with the interface circuitry of both die configured in the single-bit binary configuration ("CONFIGURATION A"). The electrical test may involve any one of a variety of signaling tests to confirm the mechanical and electrical integrity of each contact-to-contact connection between the first and second sets of contacts. For one embodiment, separate known data patterns may be fed through each of the transmit side contacts a1-a4 for receipt by the receive-side contacts b1-b4. If the received pattern fails to match the expected pattern, then the test circuitry has detected an error. If no errors are detected from the testing, at 704, then the connections are deemed to be non-defective, and no further reconfiguring of the interfaces takes place, at 706.

Further referring to FIG. 7, in the event that an error is detected, at 704, then the interface circuitry of the first semiconductor die and the second semiconductor die undergo a reconfiguration to the multi-bit signaling configuration ("CONFIGURATION B"), and a test, at 708. The test is carried out to confirm that all of the data from a given set of signaling paths associated with the first semiconductor die, is successfully transferred to the signaling paths of the second semiconductor die. If a misalignment between the dies is such that the contacts are offset by at least a full contact pitch, indicating a further error at 710, then a further reconfiguration in the form of a signal path shift to the left or right takes place, at 712, and the test process repeating by returning to the testing of CONFIGURATION A at 702. If no errors are detected at 710, then the process ends, at 706.

For some embodiments, the control signal values associated with the reconfiguring are saved and stored in nonvolatile memory for retrieval during, for example, a subsequent initialization or startup sequence for the completed semiconductor device.

While the embodiments described above relate to 1-dimensional contact layouts, the principles described above should be understood to apply also to multi-dimensional arrays. For example, one embodiment provides a 2-dimensional array of contacts, with one dimension including a first paired-offset as described earlier, and the other dimension employing a second paired offset. Circuitry to detect and bypass defective connections for the 2-dimensional arrays of contacts may be constructed similar to the 1-dimensional array. The first paired offset and the second paired offset may allow extra space to place additional contacts. The additional contacts help to optimize the circuitry to detect and bypass defective connections.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A semiconductor device, comprising:
   a first semiconductor die having a first bonding surface that is formed with a first set of contacts patterned with a first connection pitch;
   a second semiconductor die having a second bonding surface that is formed with a second set of contacts patterned with a second connection pitch, the second set of contacts further patterned with a paired offset, the second semiconductor die bonded to the first semiconductor die such that the first set of contacts is disposed in opposed electrical engagement with at least a portion of the second set of contacts.

2. The semiconductor device of claim 1, wherein:
the second set of contacts are patterned with the second connection pitch between adjacent first and second contacts of the second set of contacts, and wherein the paired offset is added to the second connection pitch between the second contact and an adjacent third contact of the second set of contacts.

3. The semiconductor device of claim 1, wherein:
the second semiconductor die is bonded to the first semiconductor die via a die-to-wafer hybrid bonding process.

4. The semiconductor device of claim 1, further comprising:
test circuitry to detect defective connections between ones of the first set of contacts and corresponding ones of the second set of contacts.

5. The semiconductor device of claim 4, further comprising:
circuitry to reconfigure a signaling path associated with a detected defective connection; and
circuitry to adjust a data transfer rate of the reconfigured signaling path.

6. The semiconductor device of claim 5, wherein:
the circuitry to reconfigure the signaling path associated with the detected defective connection includes bypass circuitry to route data from the defective signaling path to an adjacent non-defective signaling path; and
the circuitry to adjust a data transfer rate of the reconfigured signaling path includes circuitry to transfer multiple bits per data symbol along the non-defective signaling path.

7. The semiconductor device of claim 6, wherein the circuitry to adjust the data transfer rate comprises:
interface circuitry to transfer PAM4 data.

8. The semiconductor device of claim 6, further comprising:
non-volatile storage to store a value corresponding to the reconfigured signaling path, the value retrievable during an initialization mode of operation.

9. The semiconductor device of claim 1, wherein:
at least one of the first semiconductor die or the second semiconductor die comprises a dynamic random access memory (DRAM) die.

10. A method of operation in a semiconductor device, the method comprising:
for a test operating mode,
transmitting test data from a first semiconductor die via a first set of contacts formed with a first connection pitch;
receiving at least a portion of the test data with a second semiconductor die bonded to the first semiconductor die, the second semiconductor die to receive the at least a portion of the data via a second set of contacts formed with a second connection pitch, the second connection pitch including a paired offset;
following the receiving of the at least a portion of the data, detecting defective connections between ones of the first set of contacts and corresponding ones of the second set of contacts; and
generating error information associated with the detected defective connections.

11. The method of claim 10, wherein the generating error information further comprises:
generating values corresponding to the locations of the detected defective connections; and
storing the values in storage.

12. The method of claim 11, further comprising:
for a normal data transfer operating mode,
retrieving the stored values; and
reconfiguring signaling paths associated with the stored values.

13. The method of claim 12, wherein the reconfiguring signaling paths comprises:
bypassing ones of defective signaling paths associated with the detected defective connections for transferring data by routing the data from the defective signaling paths to non-defective signaling paths; and
adjusting a data transfer rate of the adjacent non-defective signaling paths.

14. The method of claim 13, wherein the adjusting a data transfer rate comprises:
transferring multiple bits per data symbol along the adjacent non-defective signaling paths.

15. The method of claim 14, wherein the transferring multiple bits per data symbol further comprises:
generating PAM4 symbols, each PAM 4 symbol including a two-bit value;
transmitting the PAM4 symbols to the second semiconductor die;
receiving the PAM4 symbols at the second semiconductor die; and
converting the PAM4 symbols to a binary code.

16. A stacked dynamic random access (DRAM) device, comprising:
a first DRAM die bonded to a second DRAM die via a die-to-wafer or a die-to-die hybrid bonding process, the first DRAM die including a first bonding surface formed with a first set of contacts that are patterned with a constant connection pitch;
wherein the second DRAM die includes a second bonding surface that is formed with a second set of contacts patterned with an aperiodic connection pitch, the aperiodic connection pitch comprising a second connection pitch between adjacent first and second contacts of the second set of contacts, and between adjacent third and fourth contacts of the second set of contacts, and wherein the second and third contacts of the second set of contacts are separated by a third connection pitch that is larger than the second connection pitch, the second DRAM die bonded to the first semiconductor die in a stacked orientation such that the first set of contacts are disposed in opposed electrical engagement with at least a portion of the second set of contacts.

17. The stacked DRAM device of claim 16, wherein:
the second set of contacts are patterned with redundant contacts that extend laterally beyond a footprint defined by the first set of contacts.

18. The stacked DRAM device of claim 16, further comprising:
test circuitry to detect defective connections between ones of the first set of contacts and corresponding ones of the second set of contacts.

19. The stacked DRAM device of claim 18, further comprising:
circuitry to reconfigure a signaling path associated with a detected defective connection; and
circuitry to adjust a data transfer rate of the reconfigured signaling path.

20. The stacked DRAM device of claim 19, wherein:
the circuitry to reconfigure the signaling path associated with the detected defective connection includes bypass circuitry to route data from the defective signaling path to an adjacent non-defective signaling path; and
the circuitry to adjust a data transfer rate of the reconfigured signaling path includes circuitry to transfer multiple bits per data symbol along the non-defective signaling path.

\* \* \* \* \*